United States Patent [19]

Mosher et al.

[11] Patent Number: 5,256,582
[45] Date of Patent: Oct. 26, 1993

[54] METHOD OF FORMING COMPLEMENTARY BIPOLAR AND MOS TRANSISTOR HAVING POWER AND LOGIC STRUCTURES ON THE SAME INTEGRATED CIRCUIT SUBSTRATE

[75] Inventors: Dan M. Mosher; Cornelia H. Blanton; Joe R. Trogolo, all of Plano; Larry Latham, Garland; David R. Cotton; Bob Todd, both of Plano, all of Tex.

[73] Assignee: Texas Instruments Incorporated, Dallas, Tex.

[21] Appl. No.: 800,869

[22] Filed: Nov. 27, 1991

Related U.S. Application Data

[63] Continuation of Ser. No. 671,625, Mar. 19, 1991, abandoned, which is a continuation of Ser. No. 561,490, Aug. 1, 1990, abandoned, which is a continuation of Ser. No. 309,515, Feb. 10, 1989, abandoned.

[51] Int. Cl.[5] .................... H01L 21/00; H01L 21/02; H01L 21/22; H01L 21/26
[52] U.S. Cl. ........................ 437/31; 437/32; 437/33; 437/51; 148/DIG. 9; 257/368
[58] Field of Search .............. 437/31, 32, 33, 41, 437/51, 52; 357/33, 34, 41, 42, 43; 148/DIG. 9, DIG. 11

[56] References Cited

U.S. PATENT DOCUMENTS

| | | | |
|---|---|---|---|
| 4,475,279 | 10/1984 | Gahle | 437/31 |
| 4,727,046 | 2/1988 | Tuntasood et al. | 437/31 |
| 4,799,098 | 1/1989 | Ikeda et al. | 357/43 |
| 4,806,499 | 2/1989 | Shinohara | 357/43 |

FOREIGN PATENT DOCUMENTS

| | | | |
|---|---|---|---|
| 0250721 | 1/1988 | European Pat. Off. | 357/43 |
| 0179564 | 7/1988 | Japan | 357/43 |
| 0161658 | 7/1989 | Japan | 357/43 |
| 0189155 | 7/1989 | Japan | 357/43 |

OTHER PUBLICATIONS

Cole, B., Is BiCMOS the Next Technology Driver, Electronics, Feb. 4, 1988, pp. 55–67.

Primary Examiner—Brian E. Hearn
Assistant Examiner—B. Everhart
Attorney, Agent, or Firm—B. Peter Barndt; Richard L. Donaldson

[57] ABSTRACT

The present invention relates to a method of manufacturing a semiconductor integrated device and, more particularly, to a semiconductor integrated device having NPN and PNP power and logic devices combined with complementary MOS and DMOS devices. The present invention is a multipitaxial process for fabricating a high power/logic complementary bipolar/MOS/DMOS (CBiCMOS) integrated circuit. The process steps for fabricating the novel integrated circuit combines on the same substrate complementary high power, logic/analog bipolar transistors with complementary MOSGVm devices and DMOSFET devices. The present invention optimizes the characteristics of these different transistors in a single process flow. The present high power/logic CBiCMOS multiepitaxial process results in device structures having distinct technical advantages over prior art processes and structures heretofore known. For example, the present integrated circuit chip, uses bipolar power transistors instead of vertical DMOS power transistors for power applications. The bipolar power transistors are more rugged and have higher power handling capabilities than DMOS devices. Thus the bipolar transistors can be used for any out-stage configuration, including low side, high side, half bridge and full bridge output circuits. The versatility of the present process flow allows the fabrication of MOSFET, BiMOS, BiCMOS, and bipolar technology either discretely or with high power or low power NPN or PNP devices.

1 Claim, 18 Drawing Sheets

METHOD OF FORMING COMPLEMENTARY BIPOLAR AND MOS TRANSISTOR HAVING POWER AND LOGIC STRUCTURES ON THE SAME INTEGRATED CIRCUIT SUBSTRATE

This application is a continuation of application Ser. No. 07/671,625, filed Mar. 19, 1991, abandoned (which is a continuation of 07/561,490 filed Aug. 1, 1990) (now abandoned) which is a continuation of 07/309,515 filed Feb. 10, 1989 (now abandoned).

BACKGROUND OF THE INVENTION

I. Field of the Invention

The present invention relates generally to a semiconductor integrated device and, more particularly, to a semiconductor integrated device having NPN and PNP power and logic devices combined with complementary MOS and DMOS devices, and to a method of manufacturing same.

II. Description of the Related Art

Integrated circuits having bipolar and MOS transistors formed on the same semiconductor substrate have many uses in the electronics industry and are therefore in great demand. The major advantage of such devices is that they combine the high power and fast switching speeds of bipolar devices with the high density and low power consumption of MOS transistors. The diversity of uses for such BiCMOS devices has fueled a surge toward fabricating faster, denser and more powerful integrated BiCMOS devices by more individual device enhancing manufacturing processes. This surge has resulted in the advent of SMART POWER BiCMOS integrated circuit devices. Smart power devices combine power and logic devices on the same IC substrate. The power devices previously employed in such smart power ICs have been vertical Diffused Channel MOS (DMOS) transistors. One of the major advantages of this DMOS/CMOS-bipolar technology is that higher logic densities have been possible while maintaining some power handling capabilities. The major drawback to this technology becoming widely used is that DMOS technology has proved to be less rugged than bipolar components. Another problem is that there appears to be a high voltage level at which DMOS power structures do not perform well. This high voltage level has generally been lower than levels achievable with discrete power devices.

There are several distinct reasons why high voltage bipolar transistors have not been combined with MOS in the prior art smart power ICs. One specific reason has been the absence of a process flow which can optimize the power handling characteristics of the bipolar transistors without adversely altering the characteristics of the desired analog/logic transistors. Another reason has been the inability to isolate bipolar power devices from other power devices and from the logic devices, and still maintain sufficient ground plane for proper IC logic operations.

Therefore it should be apparent that a need exist for a single process flow which enables fabrication of integrated circuits having complementary bipolar power and logic transistors and CMOS and DMOS transistors. A process which optimizes the desired operating characteristics of each of such devices and which does not otherwise suffer the detriments of existing fabrication processes.

SUMMARY OF THE INVENTION

In accordance with the teachings of the present invention, the present multiepitaxial process for fabricating a high power/logic complementary bipolar/MOS/DMOS (CBiCMOS) integrated circuit eliminates or reduces the disadvantages and shortcomings associated with relevant prior art methods and structures.

Briefly, one embodiment of the present invention comprises, a N-type semiconductor substrate;

a first N-type epitaxial layer disposed over said semiconductor substrate;

a second P-type epitaxial layer disposed over said first epitaxial layer;

a third N-type epitaxial layer disposed over said second epitaxial layer, said third epitaxial layer having first, second, and third tank regions for formation of a bipolar transistor, a N-channel MOSFET and a P-channel MOSFET;

first and second P-type isolation regions for isolating said first epitaxial tank from said second and third tank regions;

a first P-type buried ground region disposed between said semiconductor substrate and said third epitaxial layer of said first tank region;

first, second, third and fourth P-type diffusion regions formed in said first tank region, said first and second P-type diffusions being disposed in said first set of isolation regions for providing respective first and second collector regions for said bipolar transistor, said third and fourth diffusions being disposed in said epitaxial layer for providing emitter regions for said bipolar transistor;

a fifth P-type diffusion disposed in said second tank region for providing a P-well for said N-channel MOSFET;

sixth and seventh P-type diffusions disposed in said third tank region for providing source and drain regions for said P-channel MOSFET;

a first N-type diffusion region formed in said first tank region between said third and fourth P-type diffusions for providing a base region for said bipolar transistor;

second and third N-type diffusions formed in said second tank region for providing source and drain regions for said N-channel MOSFET.

The novel features which characterize the present invention are defined by the appended claims. The foregoing and other features, benefits and advantages of the invention will hereinafter appear, and for purposes of illustration only, and not of limitation, a preferred embodiment is depicted in the accompanying drawings and described hereinafter

BRIEF DESCRIPTION OF THE DRAWINGS

Further features and advantages of the present invention will become more apparent from the following and more particular description of the various embodiments of the invention, as illustrated in the accompanying drawings, wherein.

For ease of illustration, all diffusions are assumed to be complete in the designated cross section, whereas in reality certain diffusions are interrupted for other implants or depositions and may not be complete until subsequent thermal cycles are completed.

DETAILED DESCRIPTION OF THE PREFERRED EMBODIMENTS

Figure 1:
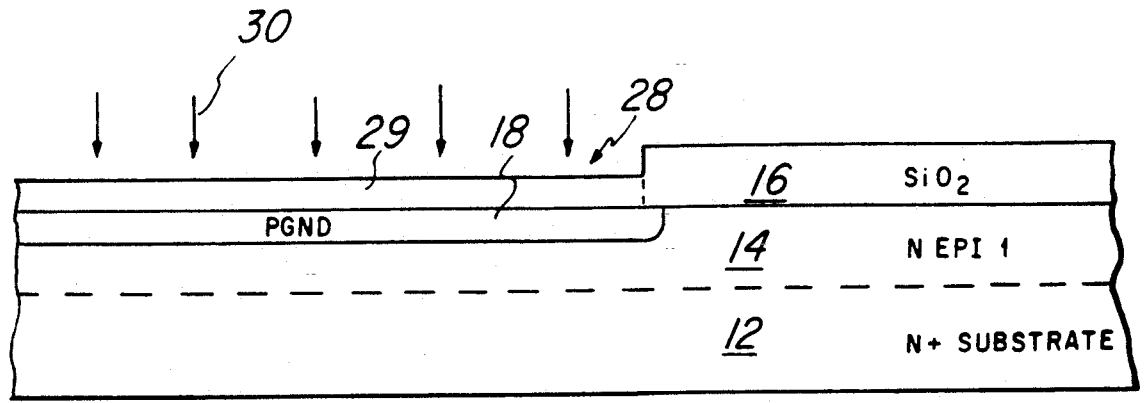
FIGS. 1–10 are enlarged cross sections of a semiconductor wafer, not to scale, serving to illustrate the sequence of process steps for the fabrication of ICs in accordance with the present invention.

Referring now to the drawings, wherein like reference characters designate like or corresponding parts throughout the several views, FIG. 1 depicts a schematic cross-section of a single crystalline wafer or substrate used in a preferred embodiment of the present invention. Wafer 12 has a <100> crystal orientation, is impurity doped with N conductivity type donor atoms, and has a resistivity of approximately 0.01 to 0.02 Ohm-cm. FIG. 1, depicts for purposes of simplicity, only part of a full semiconductor substrate as used according to the present process. It is to be understood that the substrate can be sufficiently sized for fabrication of all the various types of semiconductor devices described herein. Therefore processing steps not specifically described or depicted in the drawings are deemed to be well known to one of ordinary skill in the art of semiconductor processing. Referring again to FIG. 1, a first N-type epitaxial (epi) layer 14 is formed on wafer 12. Epitaxial layer 14 may be deposited or grown on wafer 12 by conventional and well known methods such as a batch reactor or continuous oxide chemical vapor deposition, molecular beam epitaxy, etc. Epi layer 14 is multi-functional. For example, it serves as a collector for a vertical NPN transistor. Accordingly its thickness and doping level must be selected according to the desired voltage characteristics and Forward Bias Safe Operating Area (FBSOA) requirements of the overall IC device as well as the breakdown voltage requirements between the backside and the ground plane of particular individual devices of the IC. In a preferred embodiment a thickness of 24 um and a resistivity of 6.5 Ohm-cm is desired.

The exposed surface of epi layer 14 is next thermally oxidized to form oxide layer 16 to a thickness of approximately 6500 A (angstroms). A layer of photoresist (not shown) is spun over oxide 16. The oxide is then photolithographically patterned and exposed to open regions 28 which are to contain first buried regions referred to herein as P-ground (PGND) 18. Alternatively, an E-beam pattern can be used. The preference of photoresist or E-beam resist is immaterial to the present invention. The exposed oxide and subsequently the resist material are removed by stripping in a HF bath or other well known method.

Before implantation of the PGND regions, a preimplant oxide 29 is thermally grown in the exposed regions to a thickness of 15 approximately 825 A. The PGND regions are formed by a 110 KeV Boron implant dose 30 of approximately 2.0E14 atms per-cm$^2$ through the preimplant oxide. The wafer is then subjected to a thermal diffusion for 600 min. at 1200 C. (Celsius) in a nitrogen ambient followed by a 150 min., 950 C. steam. This forms a 5000 A oxide layer (not shown) over regions 18 and the diffusion has a sheet resistance of 170 ohms/square. P-ground region formation is an optional step in the formation of some types of transistors of the present invention. For example such PGND regions are beneficial for the present bipolar double diffused high voltage NPN transistors, bipolar double diffused low voltage NPN transistors, bipolar high voltage vertical/lateral PNP transistors, bipolar low voltage lateral PNP transistor and bipolar low voltage substrate PNP transistor DMOS and CMOS transistors.

Figure 2:
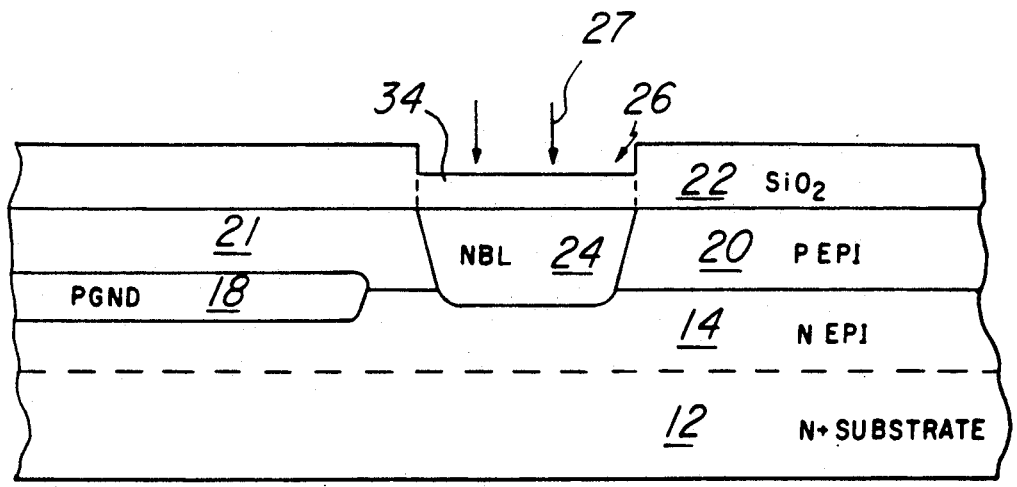

Referring now to FIG. 2, after formation of the p-ground buried regions 18, the overlying oxides are removed and a P-type epitaxial layer 20 is grown over first epitaxial layer 14. In accordance with the teachings of the present invention, the second epitaxial layer also has multiple uses. For example, the second epi layer forms the base region of the vertical NPN transistors, part of the collector of the vertical/lateral PNP transistors and the ground plane for any included control circuitry. This multiple use of the P-epitaxial layer is unique to the present process and is important to the operation of the various devices on a common wafer. The preferred thickness of the second epitaxial layer is used to achieve a reasonable Base Gummel number for the power NPN devices. In a preferred embodiment, a thickness of 10 um and a nominal resistivity of 2.1 Ohm-cm is chosen.

Referring again to FIG. 2, the surface of the wafer is shown having been oxidized to form a 6500 A oxide layer 22 over P-type epitaxial layer 20. Photoresist (not shown) is spun over the surface of oxide 22 and photolithographically patterned and exposed to form open regions 26 exposing the P epitaxial layer 20, whereat N-type buried layers 24, referred to herein as NBLs, are to be deposited. The NBL regions are formed by a phosphorus implant dose 27 of 8.0E14 atms per-cm$^2$ at 80 KeV through a 500 A pre-implant oxide 34 formed in the exposed regions. Next the wafer is subjected to a 1200 C., 600 min. nitrogen diffusion and a 105 min, 950 C. steam cycle. Subsequent to the steam cycle the NBLs 24 have a sheet resistance of 30 ohms/square and the overlying oxide has grown to a thickness of 4100 A. During the diffusion cycle the NBL regions diffuse down sufficiently to completely penetrate the P-epi 20 and contact first epi layer 14 to provide isolation to separate the P-epi into various regions such as regions 20 and 21. It should also be noted that the diffusion is continuous throughout the process and that during this and other temperature cycles, the implanted or diffused buried regions diffuse toward a final configuration.

Figure 3:
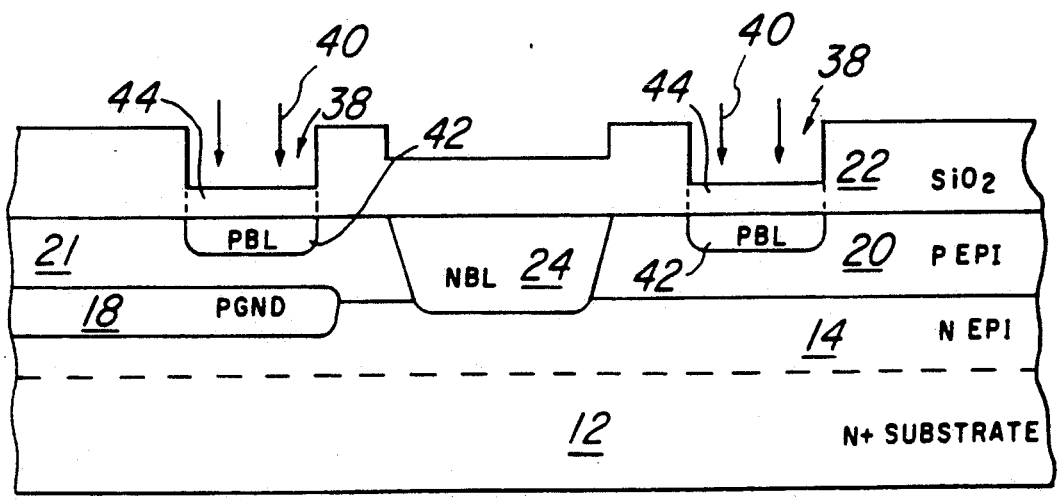

Referring now to FIG. 3, oxide layer 22 has again been photolithographically patterned (not shown) and exposed (not shown) to form regions 38 whereat P-type buried layers 42, referred to herein as PBLs, will be formed in P-epitaxial layer 20. The PBLs are formed by a Boron implant dose 40 of 2.0E14 atms per-cm$^2$ at 60 KeV through a 825 A preimplant oxide 44 formed on the surface of the wafer. The Boron implant is followed by a 200 min., 1200 C. nitrogen diffusion followed by a 105 min., 950 C. steam cycle. This sequence results in a sheet resistance of 160 ohms/square and a PBL oxide thickness of 4100 A. Upon completion of the entire process the PBL sheet resistance will decrease to 130 ohms/square. In some structures PBL regions are formed to provide isolation and separation of a N-type epitaxial layer which will be formed over the P-type epitaxial layer. The PBL regions up-diffuse during processing to join with down diffusing P+ regions which will be formed in the third N-type epitaxial layer as described herein after.

Figure 4:
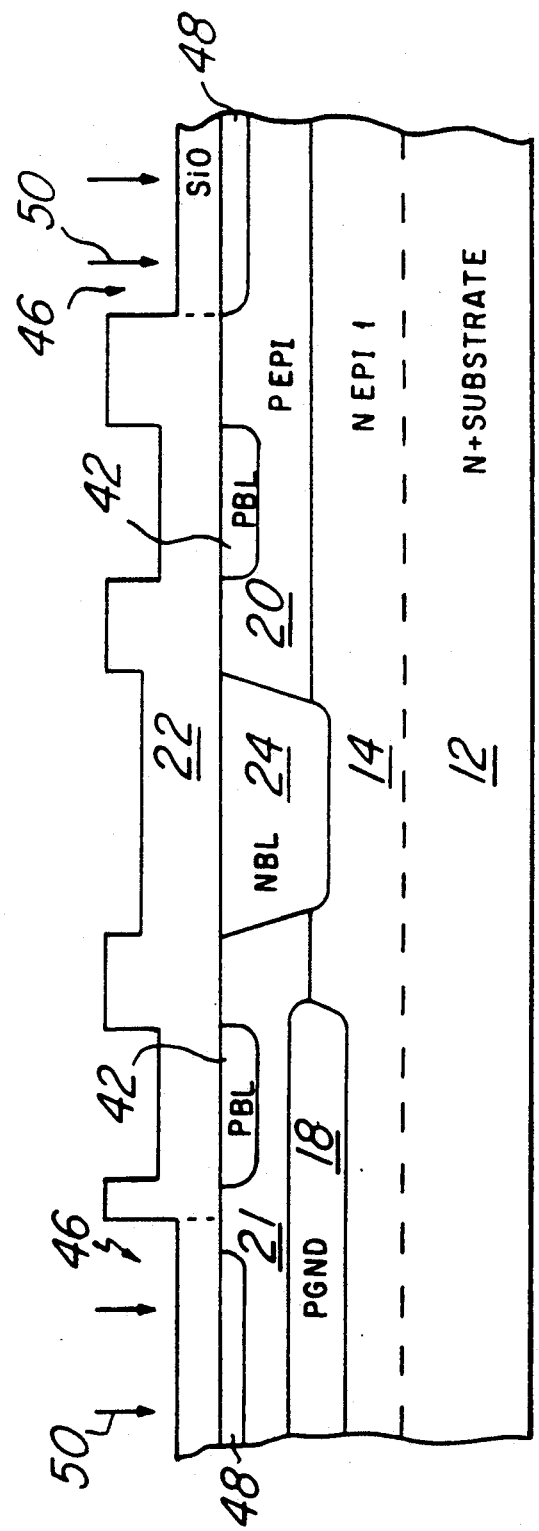

Referring now to FIG. 4, oxide layer 22 has again been patterned (not shown) and exposed to form openings 46 whereat a buried Diffusion Under Film or DUF region 48 is formed in the exposed regions of the wafer. The DUF regions are fabricated using an Antimony implant dose 50 of 1.0E15 atms per-cm$^2$ at 60 KeV energy followed by a 200 min., 1200 C. diffusion in a 10% oxygen ambient and a 950 C., 25 min. steam cycle. The resultant DUF region 48 has a sheet resistance of 48 ohms/square and an oxide thickness of 2200 A. The sheet resistance is reduced during subsequent processing to 33 ohms/square. Examples of some of the devices which may include DUF regions 48 are the bipolar vertical backside collector output NPN transistor, bipolar double diffused low voltage NPN transistor, bipolar high voltage lateral PNP transistor, and bipolar low voltage lateral PNP transistor and MOS transistors. A DUF may also be photolithographically defined in the emitter region of the bipolar vertical backside collector output NPN transistor to enhance emitter injection efficiency. A DUF may also be used in portions of the control circuitry to reduce lateral resistance within a surface tank or to inhibit the punch through of surface devices to the underlying P-epi layer. The above list is merely illustrative of the examples and should not be considered exhaustive.

Figure 5:
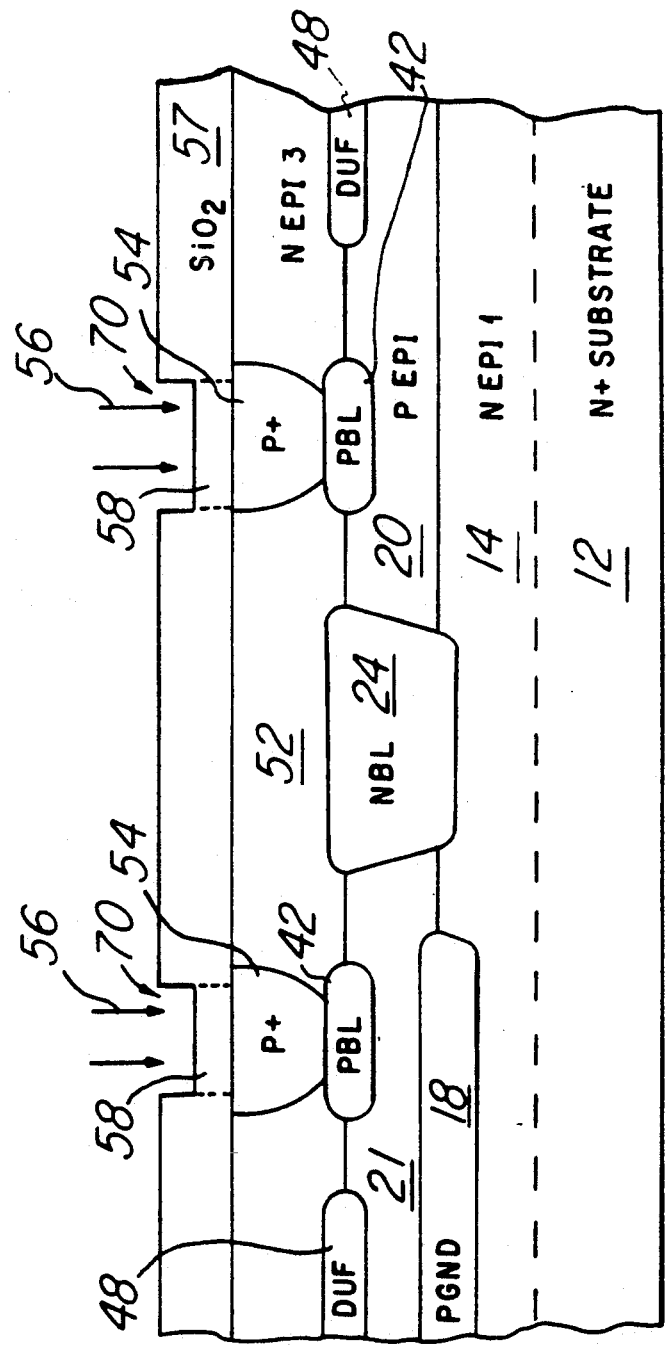

Referring now to FIG. 5, the photoresist material and oxide have been removed. The third, N-type epitaxial layer 52 is then grown over the second P-type epitaxial layer 20. In accordance with the teachings of the present invention this layer also serves different functions depending on which type of active or passive device is formed therein. For example, epitaxial layer 52 forms the emitter of the vertical NPN transistor, the base of the Vertical/lateral power PNP transistor, and serves multiple functions for the control circuitry such as the NPN collector, PNP base, PMOS backgate and possibly high value resistors. Accordingly the thickness and resistivity of epitaxial layer 52 must be selected so as to establish a sufficient breakdown voltage for the Vertical/Lateral PNP and surface logic devices and emitter resistance of the vertical NPN. In a preferred embodiment a nominal resistivity of 3 Ohms-cm and a thickness of 15 um is suitable for a variety of device applications.

Individual device isolation is achieved in some embodiments, when needed, by the formation of P+ isolation regions 54 in the surface of N-type epitaxial layer 52. The isolation regions can be formed by a variety of methods, such as ion implantation or deposition. In a preferred embodiment, the P+ isolation regions are formed by a surface Boron deposition. The surface of second N-type epitaxial layer 52 is first thermally oxidized to a thickness of 4000 A 57 and the P+ regions are photolithographically defined (not shown). In general the P+ regions will coincide with the previously defined PBL regions 42, however this may vary for some applications. Such as for some NMOS devices. The P+ regions 54 are formed through a BBr3 thermal deposition 56 at 1100 C. followed by a 1200 C. diffusion cycle that yields a sheet resistance of about 7 ohms/square. Up-diffusion of the sub-surface PBL regions 42 and the down diffusion of the coincident P+ regions 54 combine to form isolation for the surface epi tanks, which will contain the logic components and DMOS devices. In addition to providing tank isolation, the PBL-P+ combination also provides a low resistance contact to control the base of the vertical NPN transistors, part of the collector of the Vertical/Lateral PNP and the surface contact for the logic ground plane.

An optional N+ layer may be patterned next in the existing oxide followed by a Phosphorous (POCl3) deposition and diffusion to create a low sheet resistivity layer of approximately 1.0 ohm/square which is diffused from the surface of the top epi layer to form a low resistivity path 128 down to the buried DUF layer 48. This diffusion acts as a low series resistance connection from the top of the device to the DUF layer to minimize the collector series resistance of the NPN control logic and any optional Dmos devices. It can also act as a low resistivity series connection to the backside of the device via the DUF and NBL for voltage sensing of the substrate. After the N+ diffusion all oxide on the surface of the wafer is completely deglazed if a Silicon gate MOS transistor is going to be fabricated.

Figure 18:
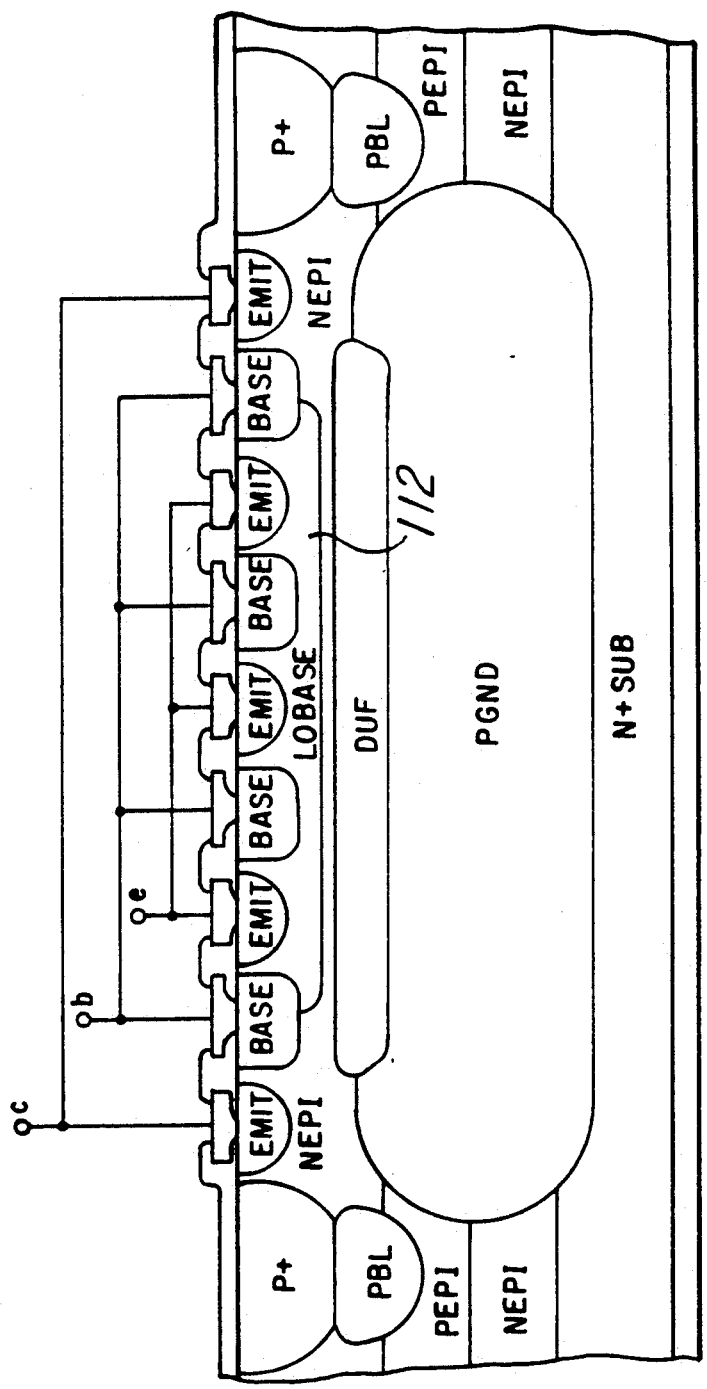
Figure 19:
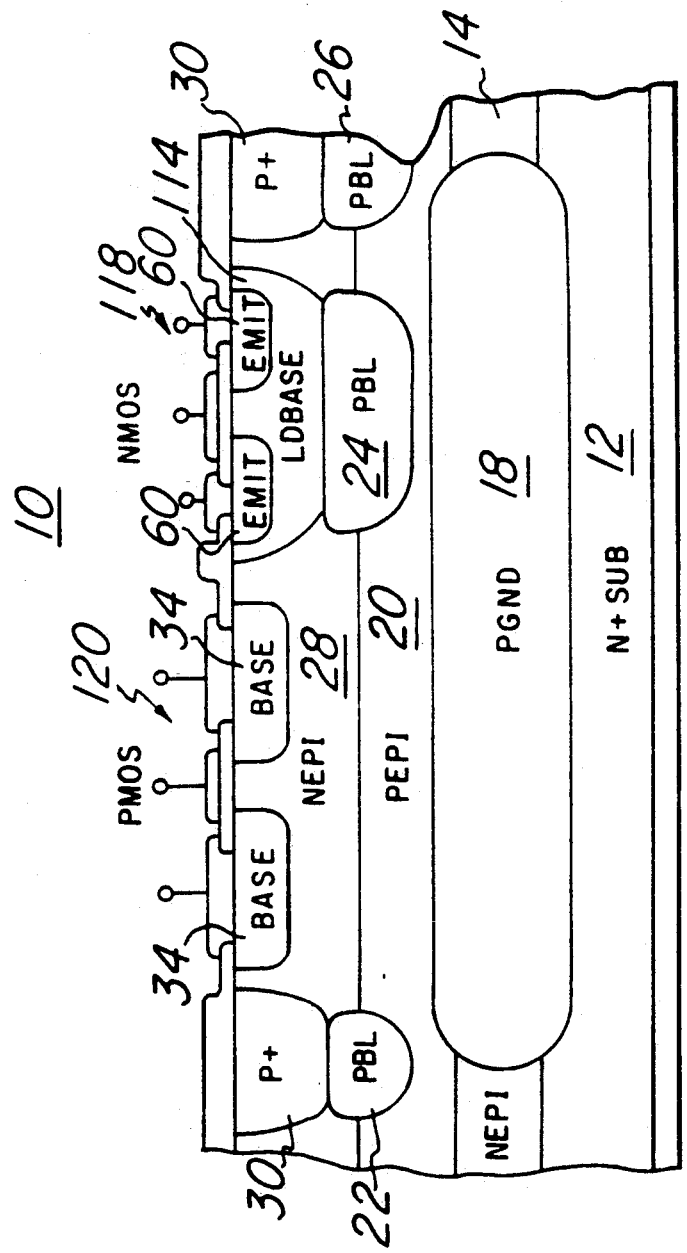

Over some tank regions, the resulting oxide 57 may be photolithographically defined (not shown) and exposed to define an optional Boron implanted region, referred to herein as Lightly Doped Base (LDB) regions, 112 and 114, as shown in FIGS. 18 and 19. This region may be used to create the base of a vertical, double diffused NPN transistor (FIG. 18) that will provide higher emitter-to base breakdown voltage than would be achievable with a conventional high concentration base layer. The lightly doped base regions also provide excellent P-wells for NMOS devices, as depicted in FIG. 19. Additionally, it may driven very deep until it becomes continuous with a sub-surface PBL (FIG. 20) of a NMOS or P-epi to form a very wide base for a vertical NPN. In view of the multiple uses of the lightly doped base regions of the present invention a preferred formation sequence comprises a 825 A preimplant oxidation of the LDB window followed by a Boron implant dose of 2.0E13 atms per-cm$^2$ at 80 KeV. This is followed by a 1200 C. diffusion cycle. This sequence results in an oxide thickness of 3800 A and a sheet resistance of 1300 ohms/square. The sheet resistance value also makes the LDB regions suitable for moderately valued resistors.

Figure 20:
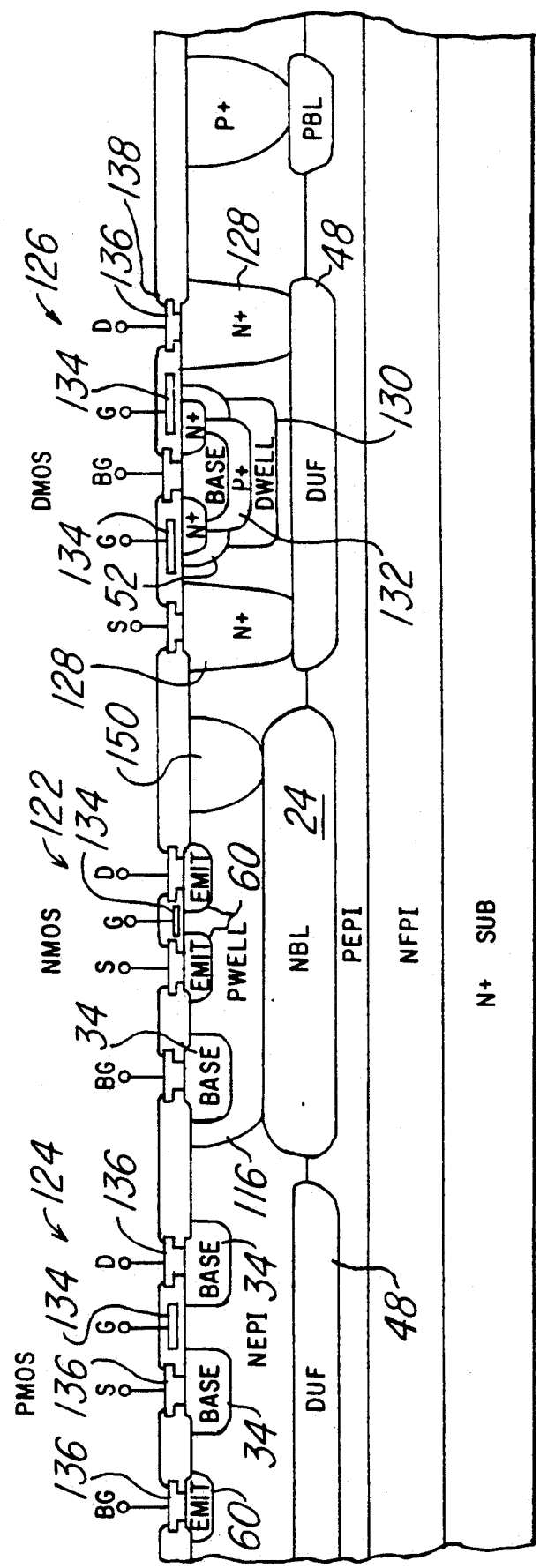

Referring briefly to FIGS. 19 and 20, the NMOS 118/122 and PMOS 120/124 control logic and the DMOS 126 device are manufactured on the surface of the top N-type epi layer 52 in the following manner. The NMOS devices are situated in a Pwell which is photolithographically defined (not shown) in the oxide which exists on the wafer after P+ Isolation diffusion. This Pwell could be, but is not restricted to, a Lightly Doped Base region 114 formed as described hereinabove. Alternative Pwells could be a BASE region 55 formed as described hereinabove. The Pwell can be isolated in an epi tank; but where the NMOS will be operated with the Pwell at isolation potential the Pwell will extend into the isolation diffusion and will be contained by PBL to lower the well sheet resistance and improve immunity to NMOS latch up. A preferred Pwell is formed by a Boron implant through a 825 A preimplant oxide layer and diffused at 1200 C. to form a high resistivity well of approximately 1300 Ohm/Sq.

The PMOS devices are situated in a Nwell. The Nwell may simply be an isolated top epi tank. However, a N-type well can be used to improve PMOS electrical performance and decrease device size by minimizing the PMOS channel lengths while avoiding PMOS electrical shorts due to source depletion layer punch through to drain. The Nwell is photolithographically defined (not shown) in the existing oxide after Pwell diffusion and is followed by a 825 A oxidation through which Phosphorous is implanted and diffused into the Epi tank.

The Silicon gate technology follows the completion of the epitaxial stack, the subsequent top P+ isolation diffusion and the N+ diffusion and deglaze as described hereinafter. A thin oxide layer of approximately 700 A referred to as Pad Oxide is then grown followed by chemical vapor deposition of 1100 A silicon nitride. The Nitride is patterned using standard photolithographic techniques and then the exposed nitride is plasma etched away to create areas defined as field. The Nitride remaining on the wafer defines moat regions into which all further diffusions will take place. The NMOS field threshold voltage may now be adjusted to avoid parasitic MOS devices created by interconnect which is at a potential higher than the Nwell potential or by the charging of any surface passivation over Nwell from adjacent high voltage nodes. The threshold voltage is adjusted by implanting Boron into the Pwell while masking it from other regions by a photolithographically defined mask. This implant does not penetrate the Nitride but is self aligned to it. Similarly the PMOS field threshold voltage is adjusted using a Phosphorous implant into the Nwell. The implant dose for both NMOS and PMOS field threshold Vt adjust is adjusted so that the field threshold is greater than the maximum voltage on the CMOS supply rails and is typically in the order of 1E13 atm per-cm$^2$ for 15 v supply rails.

The wafer is then oxidized at 1000 C. to grow a field oxide which is approximately 16,000 A thick at the end of the process. The nitride is then removed from the wafer leaving the 825A Pad oxide windows behind into which further doping material is subsequently diffused. These windows are deglazed and a 800 A sacrificial, or dummy gate oxide, is grown and then deglazed. A 400 A gate oxide is then grown at 950 C. Different gate oxide thicknesses may be used depending on the voltage and electrical performance required from the CMOS and DMOS devices. The gate oxidation is followed by any PMOS or NMOS Vt adjust implants that are required to adjust the PMOS and NMOS Vt to a target value of typically −1.0 and +1.0 volt respectively. The NMOS Vt adjust may be avoided if the Pwell surface concentration is designed to set the NMOS Vt at the target value. The Vt adjust implants are masked using photolithographic techniques. A 5000 A layer of Polysilicon is then chemical vapor deposited, photolithographically patterned and plasma etched to define all Polysilicon interconnects, CMOS and DMOS gates and Poly capacitors. Multi levels of Polysilicon may be used where multi level interconnect or Poly to Poly capacitors are required. These levels may be separated by thermal oxide or deposited Teos oxide. A process variant may include Poly to Poly capacitors that have a combination of oxide and nitride dielectric layers between the Poly capacitor electrodes to maximize the Poly to Poly capacitance per unit area. In this process the nitride would be deposited and patterned in a way similar to the definition of nitride over moat areas. After the polysilicon is defined the moat areas into which all further diffusions are performed are covered with the exposed gate oxide.

As previously intimated, an option exists to add Silicon gate DMOS devices for multi-output high voltage or high current devices if required. This option requires two extra photolithographic mask steps. The first is a DMOS well 130 (Dwell or DMOS backgate) which is followed by a Boron implant and diffusion. The second is a P+2 Boron deposition and diffusion. The heavily doped P+2 Boron layer 132 is diffused into the DMOS backgate to improve the safe operating area (SOA) of the device.

After the Poly has been defined the DMOS well is formed. An implant mask is defined photolithographically and Boron is implanted through the exposed gate oxide with a dose of approximately 1E14 atm per-cm$^2$. The implant is self aligned to the DMOS Poly gate. The implant is then diffused to a penetration of approximately 4 um. The P+2 region is then photolithographically defined with sufficient spacing from the DMOS Poly gate so that the subsequent P+2 lateral diffusion under the oxide diffusion mask does not alter the doping profile in the DMOS channel formed by the difference in lateral diffusion of the Dwell and DMOS source diffusions under the DMOS Poly gate. In this way the DMOS Vt is governed by the peak doping concentration in the DMOS channel and it is independent of the P+2 diffusion. The P+2 is designed to lower the sheet resistance of the P-type region below the N+ DMOS source diffusion and minimize any parasitic NPN bipolar action that might occur between the DMOS source, the DMOS Backgate and epi. The P+2 region is defined and etched using a photolithographic mask and the P+2 diffusion is diffused into the DMOS source and backgate contact region of the DMOS device.

Figure 6:
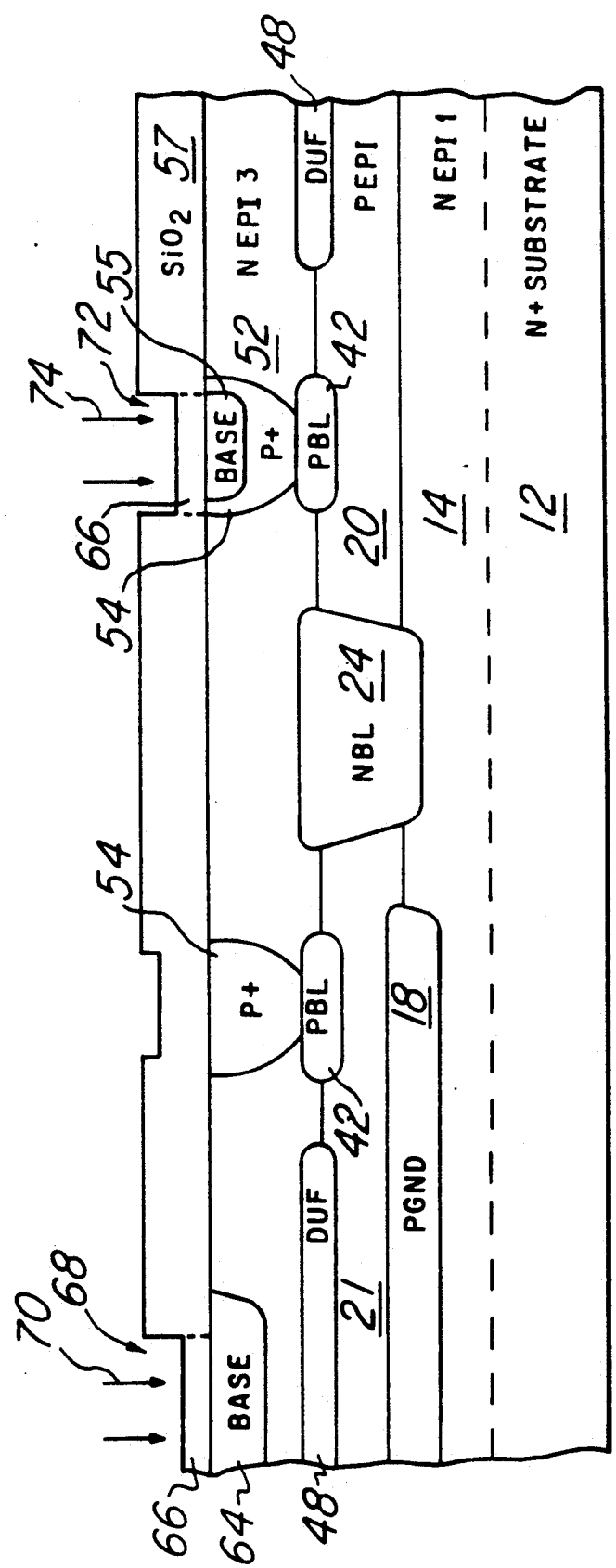

Referring now to FIG. 6, formation of boron implant regions referred to herein as BASE regions 55 and 64 is depicted. It should again be noted that although these regions may be used in the conventional manner as base regions for semiconductor devices, they may also be used to form various other active and passive device components as will be described in more detail hereinafter. Formation of the BASE regions in a preferred embodiment may comprise photolithographically patterning (not shown) the moat oxide remaining after poly definition, or after P+2 diffusion if the DMOS option is persued, and thermally growing 825 A of preimplant oxide 66 in the exposed regions. Thereafter a Boron dose 70 of 6.5E14 atms per-cm$^2$ is implanted followed by a 1100 C., 100 min. diffusion in nitrogen and a 1000 C., 42 min. steam cycle. This yields a BASE region having a sheet resistance of 160 ohms/square and an oxide thickness of 3400 A. Examples of uses of the BASE regions in the fabrication of bipolar logic structures in accordance with the teachings of the present invention, is as the base of the diffused NPN transistors, the emitter and collector of the lateral PNP transistors, the anode of zener diodes as well as low valued resistors. BASE regions may be formed between the P+ isolation regions of a given tank, within the P+ isolation regions or in unisolated tanks as desired for a particular type of transistor. Examples of the use of the BASE regions in the MOS logic structures in accordance with the teachings of the present invention, is as the source and drain of a PMOS device, the Pwell low ohmic contact region, the DMOS backgate contact region.

The CMOS source and drain diffusions are self aligned to Poly where Poly crosses Moat. The diffusions may consist of the NPN BASE diffusion for the PMOS and the NPN EMITTER diffusion for the NMOS source and drain diffusions respectively. The NPN EMITTER may also be used for the DMOS source diffusion which is also self aligned to the DMOS Poly gate. The NPN BASE diffusion may also be diffused into the DMOS backgate diffusion to minimize the oxide thickness over the DMOS backgate contact area. This simplifies the process and allows PMOS, NMOS, NPN and PNP devices to be manufactured using only two planar diffusions for the CMOS source and drains, the PNP collector, emitter and base (epi) contact and the NPN emitter, base and collector (epi) contact. Alternatively after the NPN and EMITTER diffusions are complete the PMOS and NMOS source and drain diffusions may be implanted with a separate Boron implant for the PMOS source and drain and an Arsenic or Phosphorous implant for the NMOS source and drain diffusions. While adding more complexity to the process this allows shallower CMOS source and drain diffusions of approximately 1 um junction penetration with a consequent saving in device area and switching speed performance. The NMOS source and drain diffusion may also be used for the DMOS source.

Figure 7:
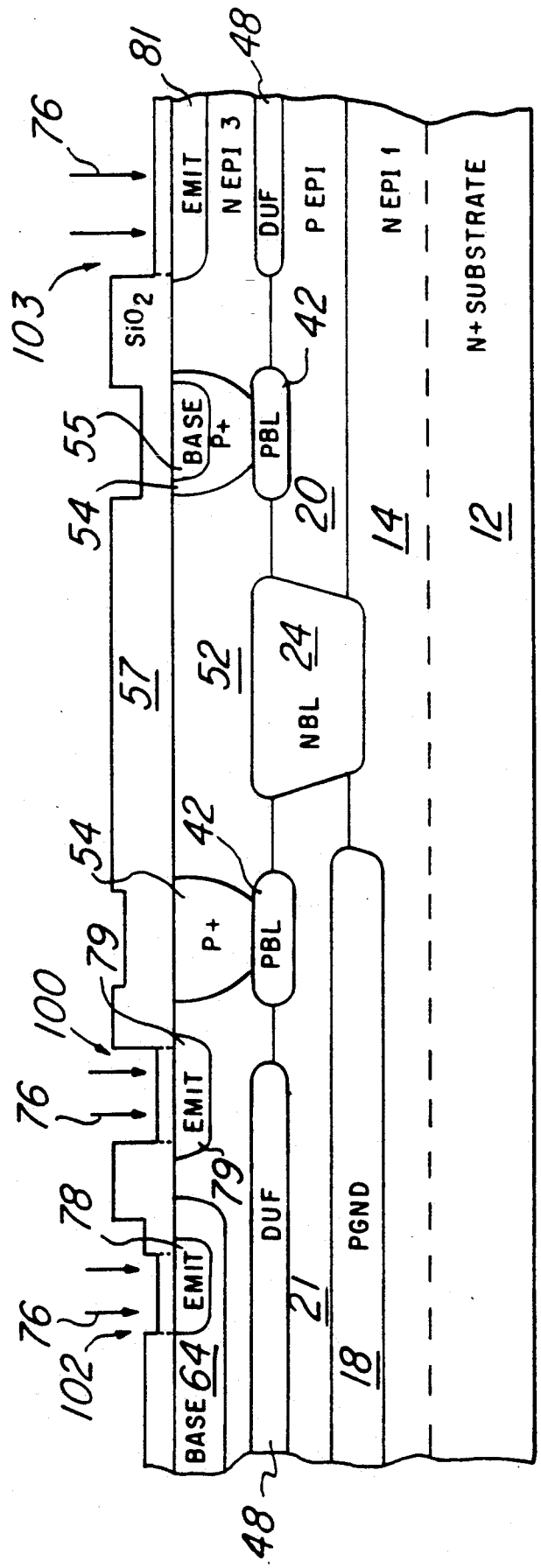
Figure 8:
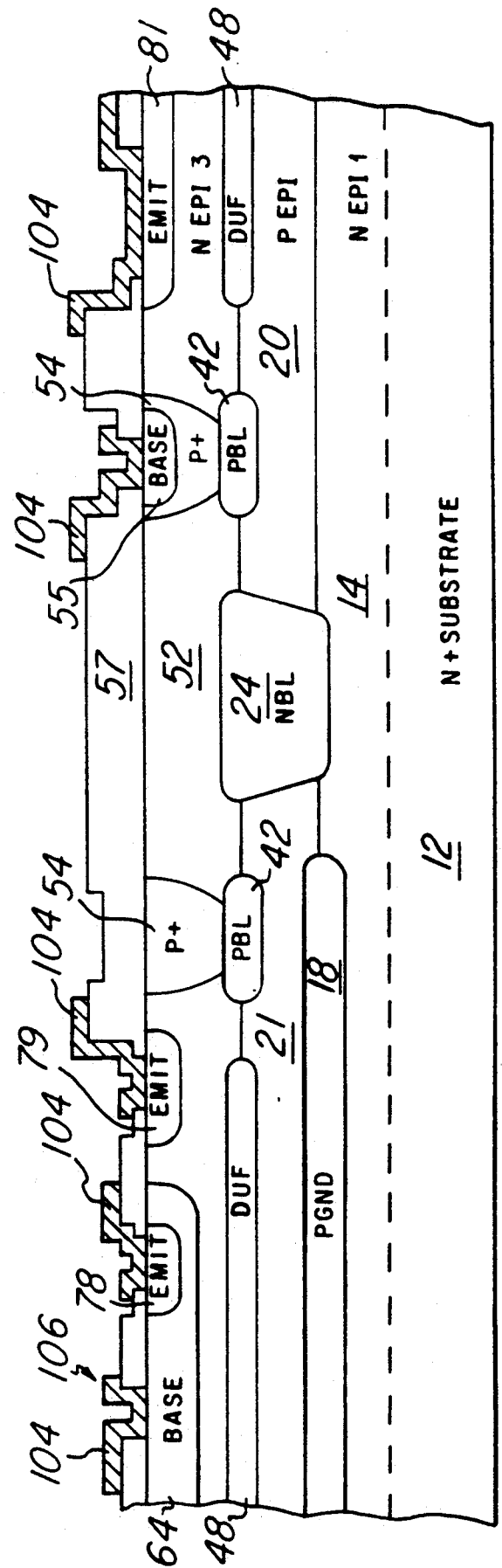
Figure 9:
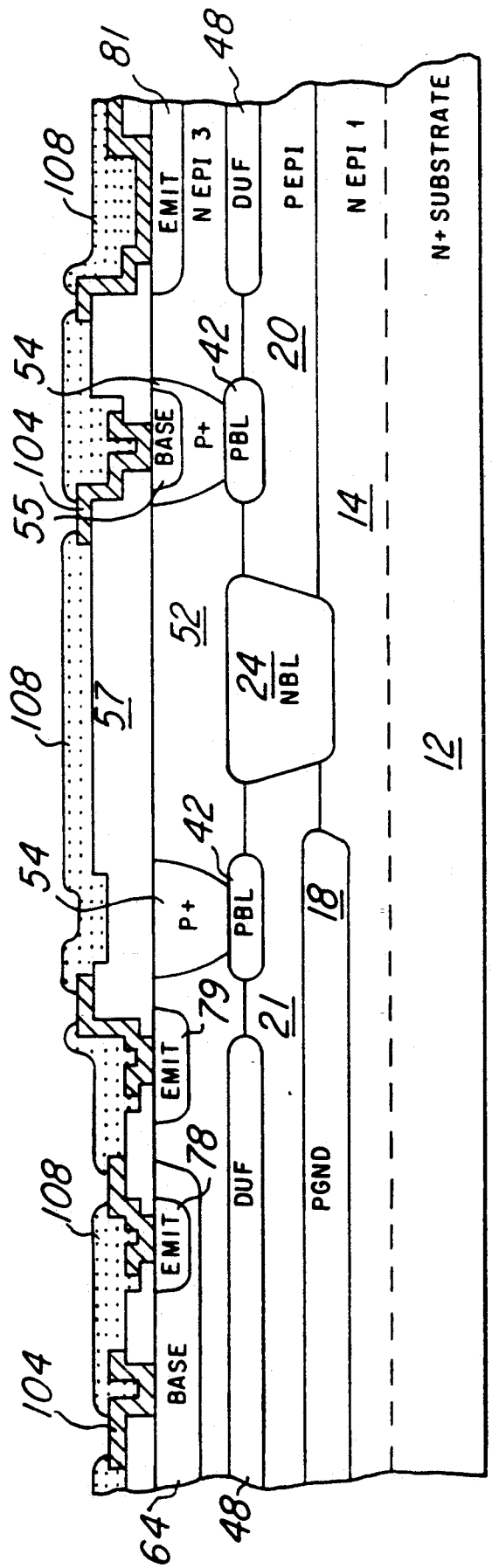
Figure 10:
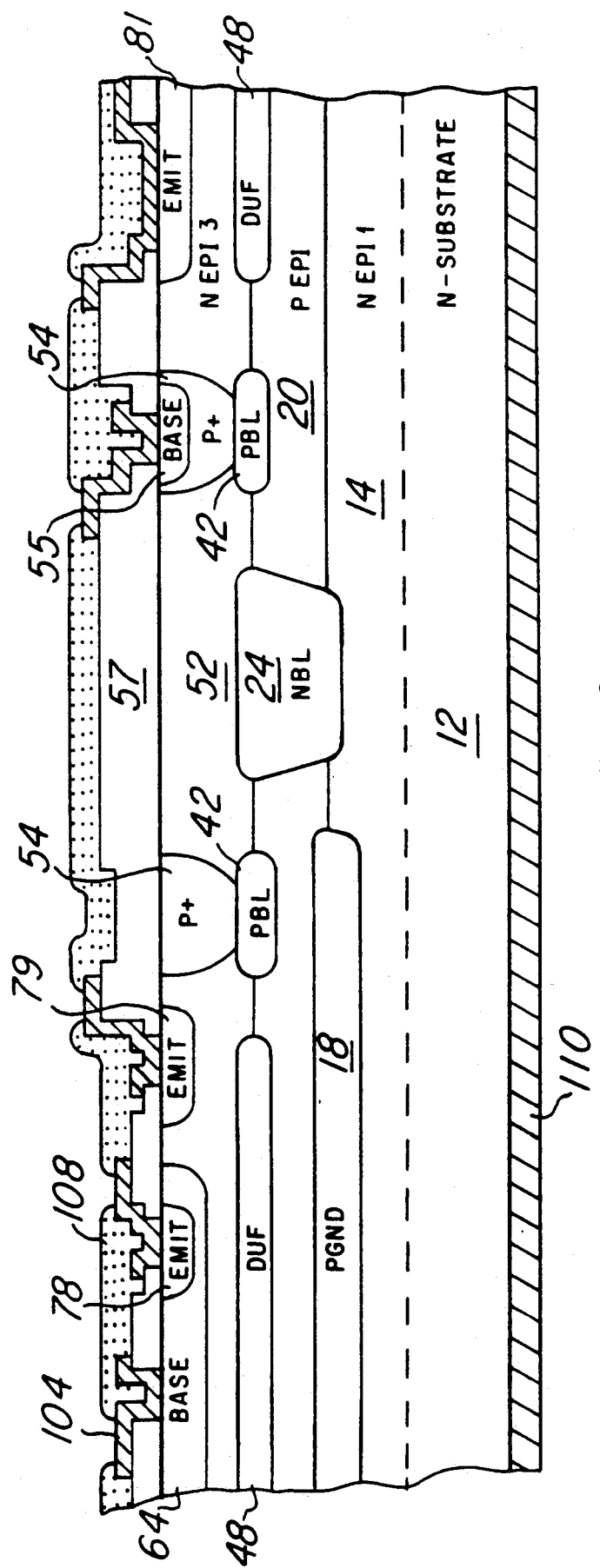
Figure 11:
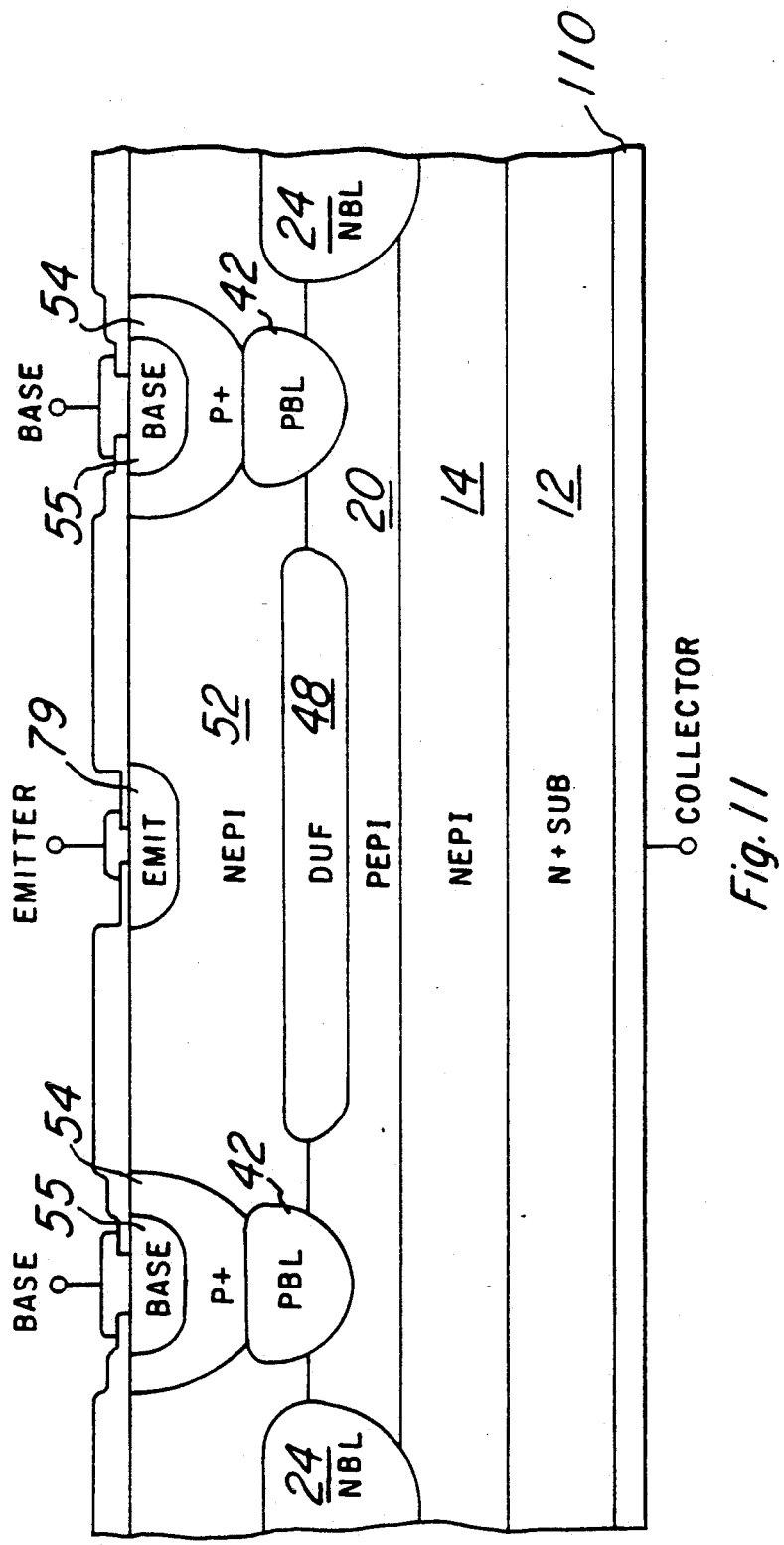
FIGS. 11–20 are enlarged cross sections of individual semiconductor devices which are part of a single continuous semiconductor integrated circuit chip.
Figure 12:
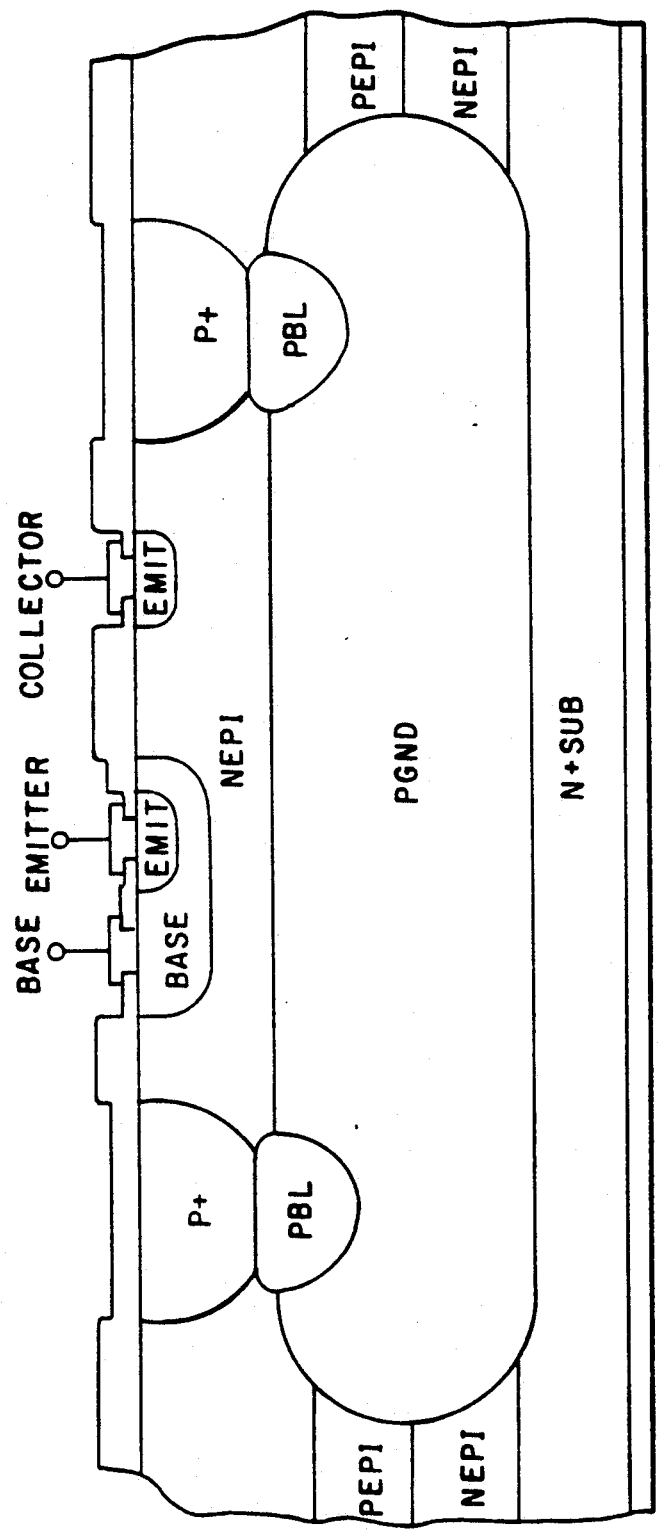
Figure 13:
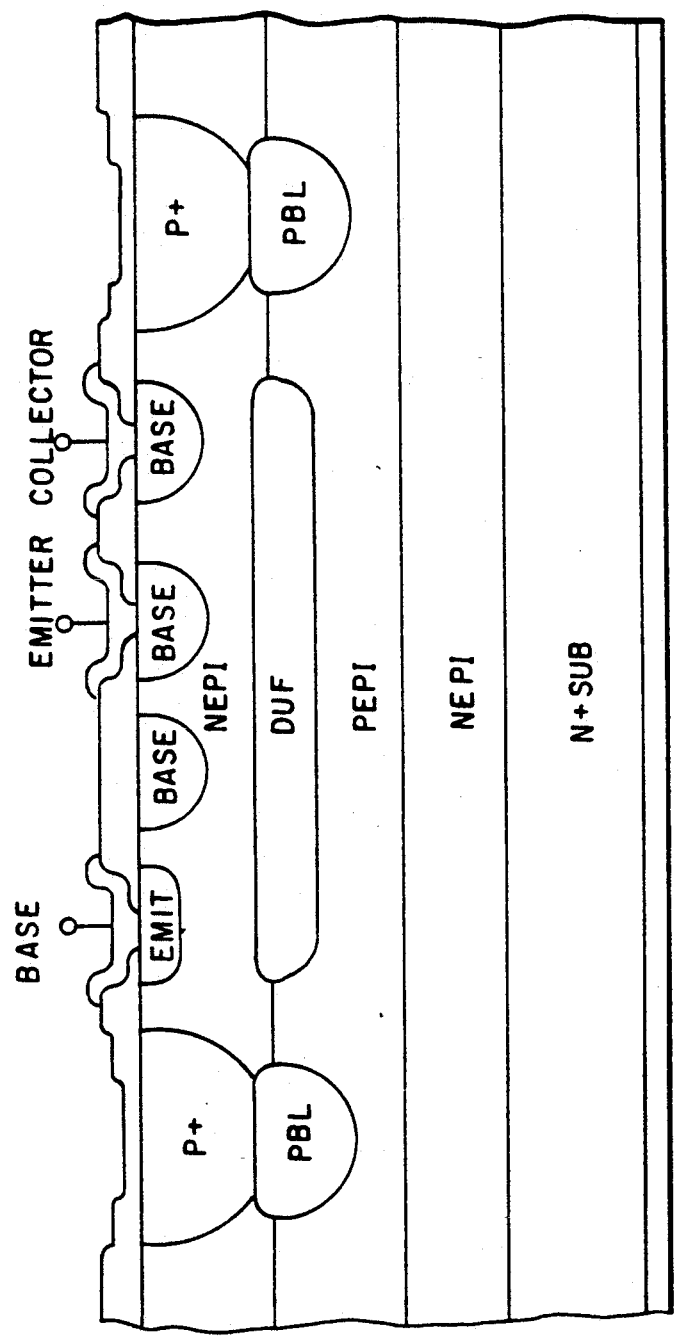
Figure 14:
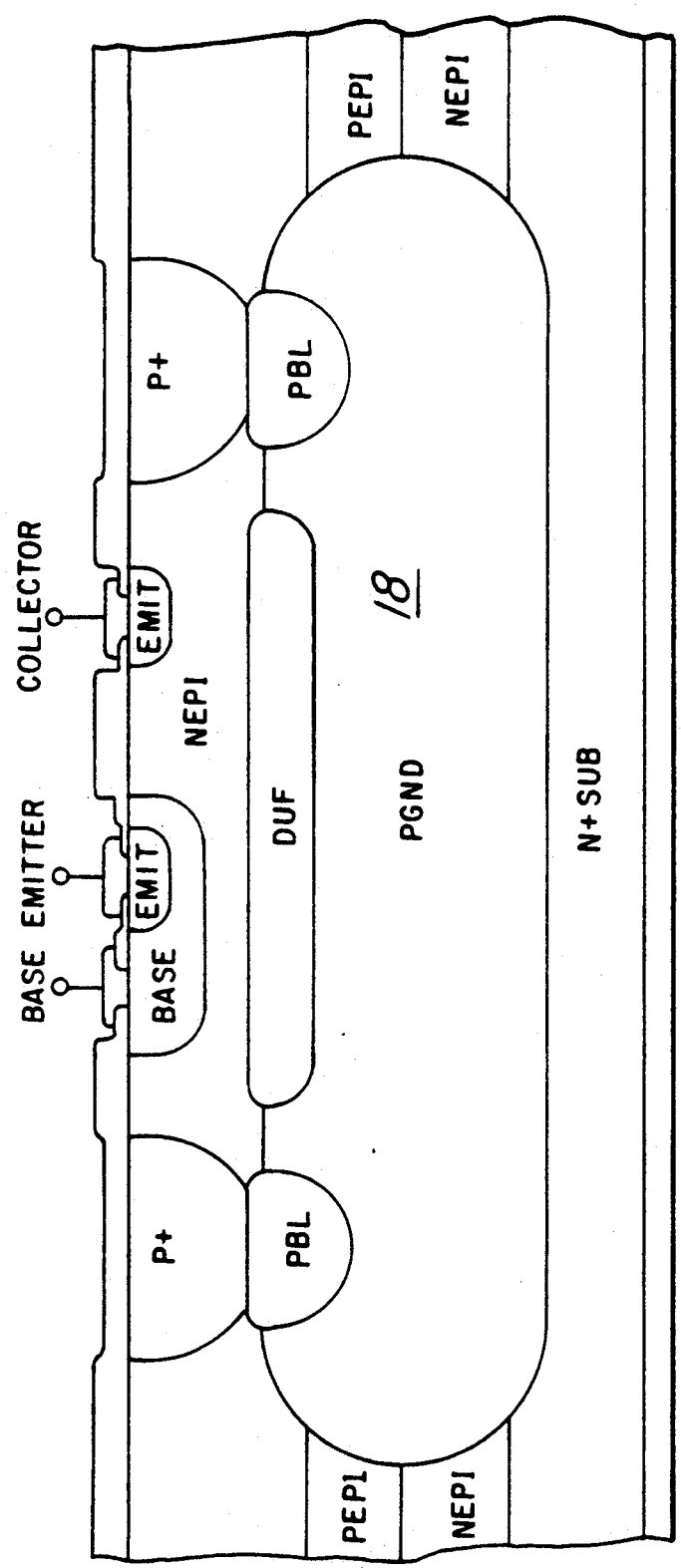
Figure 15:
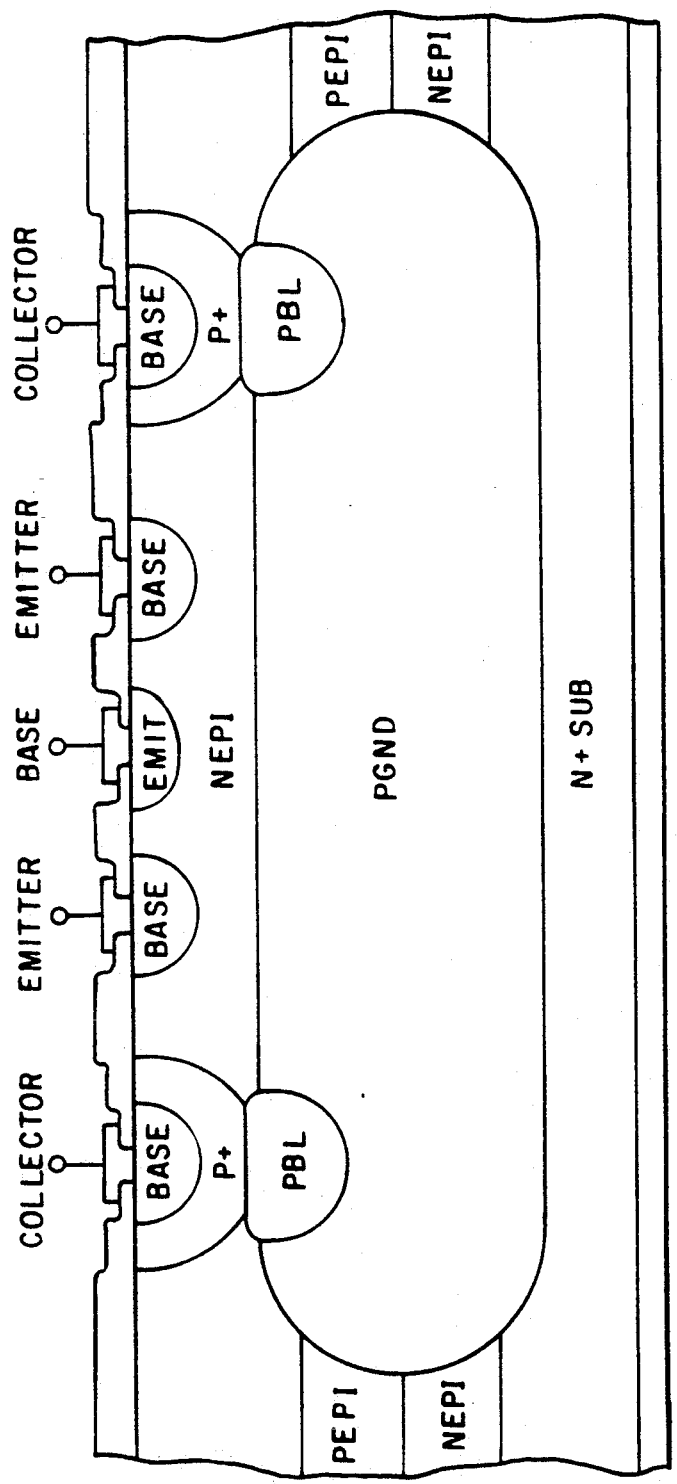
Figure 16:
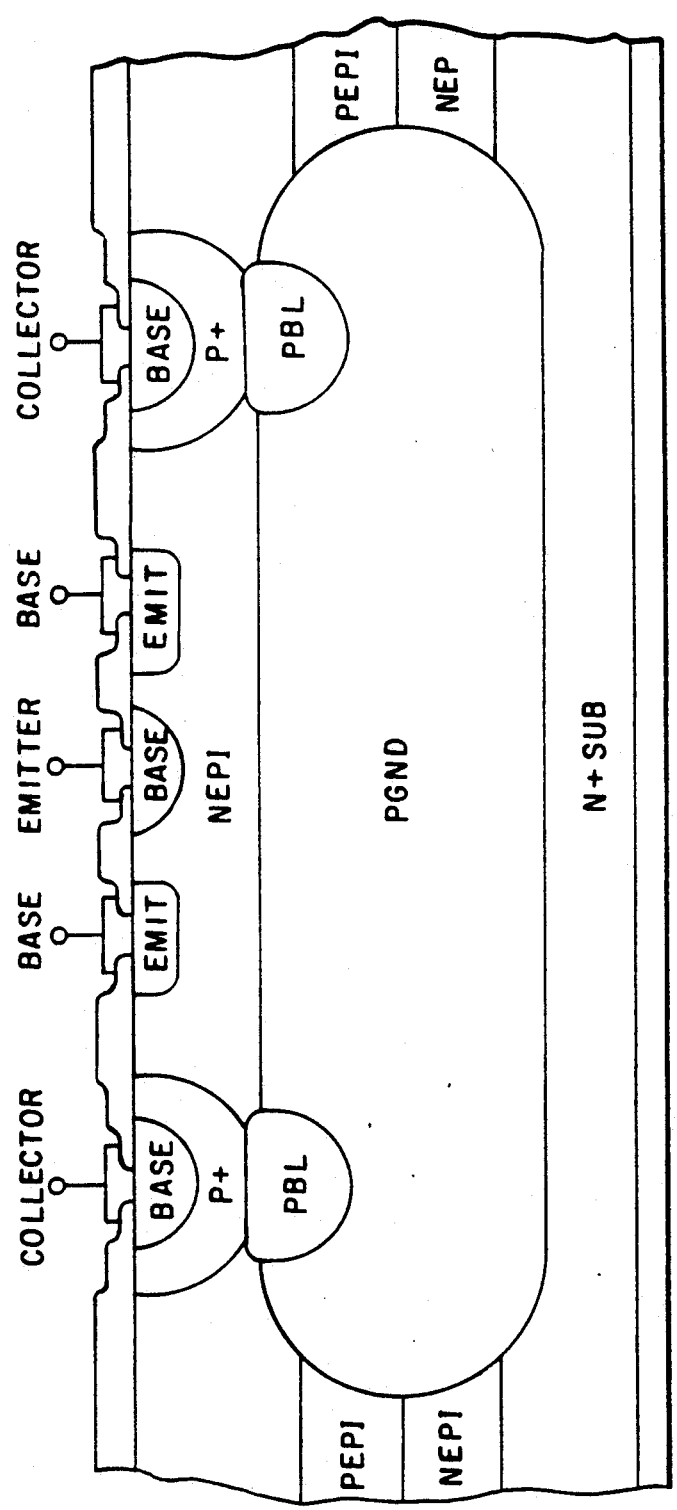
Figure 17:
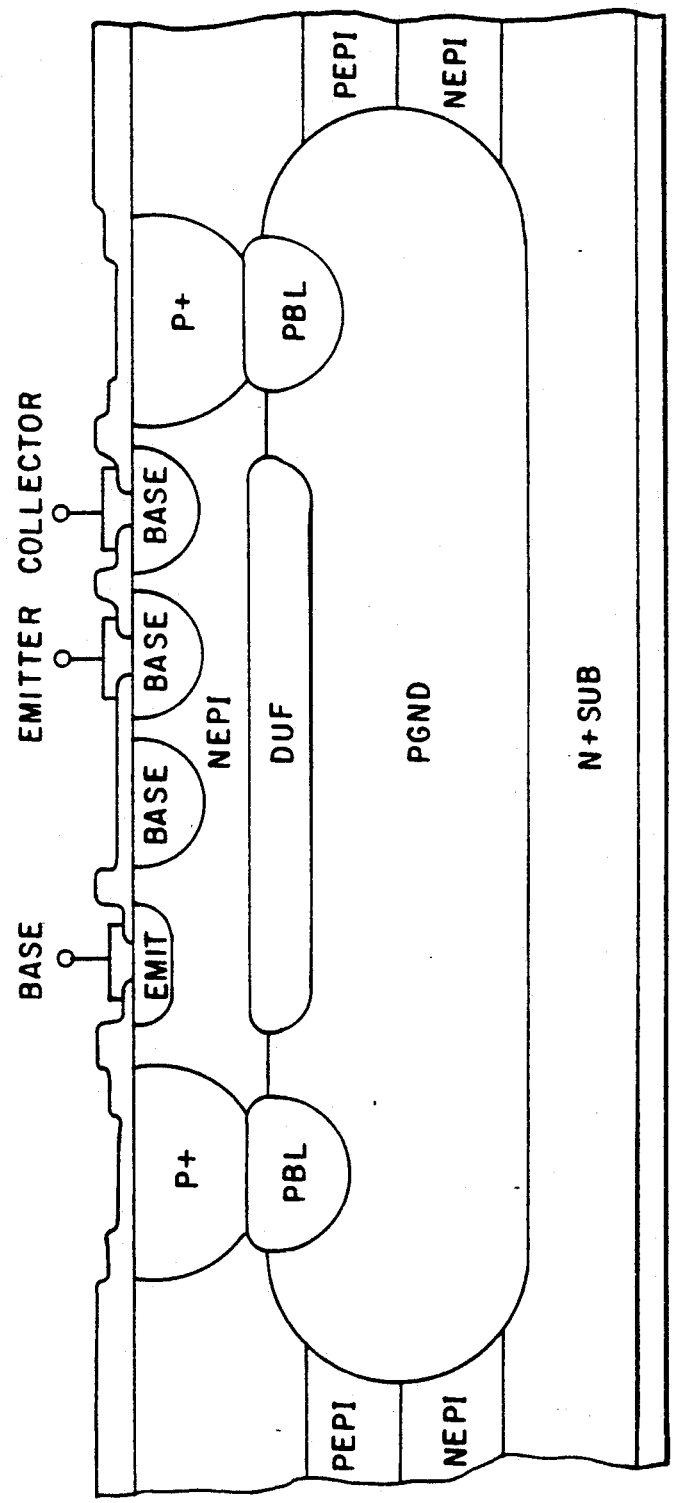

Referring now to FIG. 7, photoresist material is again patterned (not shown) and fabrication of the various device logic components is completed with a deposition and diffusion anneal at 1000 C., of a phosphorous region, such as regions 78, 79, 81, referred to herein as EMITTER region. As previously stated hereinbefore, the present process allows usage of conventional doped regions for multiple purposes in the formation of active and passive devices. For example, the EMITTER diffusion sequence results in regions having a sheet resistance of 5 ohms/square in a preferred embodiment and may be used to provide contact to the surface N-epi tanks in the formation of the present logic structures. Additionally, these regions may be used as a contact diffusion to the base region for complementary PNP devices. When used in conjunction with the NBL layer, the emitter region may be used to provide vertical contact to the N-type wafer substrate.

After the emitter or NMOS source and drain diffusion a layer of BoroPhosphoSilicate Glass (BPSG) is deposited using CVD techniques to form a high voltage insulating layer between the Polysilicon interconnect and the metallization. Contacts are photolithographically patterned and the BPSG and thermal oxide are removed to open contacts to bare silicon. An aluminum metal layer doped with silicon and copper is sputter deposited on to the wafer, patterned and then etched using conventional processing techniques. The metal thickness may be chosen to carry a required current density but it is typically 20 k or 30 k A thick. The wafer processing is complete with the deposition of a 10 k A Silicon Nitride passivation layer which is patterned and etched to open Bond pads for wire bond contacts to the package leadframe. The backside of the wafer is ground to achieve a final wafer thickness of 15 mils and a 10 K A layer of TiNiAg is deposited on the backside to achieve a low contact resistance.

FIG. 6, depicts only two of the many bipolar structures which can be fabricated on the wafer. As previously noted hereinabove, MOS devices such as those illustrated in FIGS. 19 and 20 can be fabricated concurrently with the bipolar device structures. The particular processing steps for achieving such integration is as discussed hereinbefore with reference to the bipolar process flow illustrations and the final MOS device structures.

TECHNICAL ADVANTAGES OF THE INVENTION

From the foregoing, the process steps for fabricating a novel integrated circuit which combines on the same substrate complementary high power, logic/analog bipolar transistors with complementary MOSFET devices and DMOSFET devices is disclosed. The present invention optimizes the characteristics of these different transistors in a single process flow. The present high power/logic CBiCMOS multiepitaxial process results in device structures having distinct technical advantages over prior art processes and structures heretofore known. For example, the present integrated circuit chip, uses bipolar power transistors instead of vertical DMOS power transistors for power applications. The bipolar power transistors are more rugged and have higher power handling capabilities than DMOS devices. Thus the bipolar transistors can be used for any output-stage configuration, including low side, high side, half bridge and full bridge output circuits. DMOS devices may be used in conjunction with bipolar power devices where multioutput high current devices are required.

Another attendant technical advantage of the present invention is that bipolar device isolation is achieved in the present process with steps completely compatible with the formation of MOS device structures. Another attendant advantage of the present integrated circuit chip, is that by providing the various devices on a single chip they may be integrated and connected to provide practically every imaginable circuit connection for a wide variety of functions. Another attendant technical advantage of the present invention is that the process is compatible with the formation of all types of logic components such as CMOS, TTL, etc. Another advantage of the present process is that any number of desired devices may be included or excluded from the process flow without affecting the overall advantages of the invention. This allows a particular end user to have custom designed and applications specific circuits fabricated in a mass production process flow.

It is an expected and intended use of the present integrated circuit device that it be operatively interconnected to construct electronic circuit devices capable of providing needed functions in automotive electronics, computer-peripheral applications, motor control circuits for electronic cameras, etc. The versatility of the present process flow allows the fabrication of MOSFET, BiMOS, BiCMOS, and bipolar technology either discretely or with high power or low power NPN or PNP devices, without suffering from the problems of the prior art.

The values and ranges discussed herein are given for a preferred embodiment of the present invention, of course these values may vary as the parameters are changed. Therefore it is to be understood that many changes in detail may be made as a matter of engineering choices without departing from the spirit and scope of the invention, as defined by the appended claims.

What is claimed is:

1. The method for manufacturing a semiconductor integrated device, comprising the steps of:
    providing a semiconductor substrate of a first impurity conductivity type;
    forming a first semiconductor layer of said first impurity conductivity type over said semiconductor substrate;
    forming a second semiconductor layer of a second impurity conductivity type over said first semiconductor layer;
    forming a third semiconductor layer of said first impurity conductivity type over said second semiconductor layer;
    forming a first buried region of said second conductivity type between said semiconductor substrate and said third semiconductor layer;

forming a second buried region of said second conductivity type between said semiconductor substrate and said second semiconductor layer;

forming a first set of isolation regions corresponding to said first buried region, said set including first and second pillars extending between and contacting a surface of said third semiconductor layer and said first buried layer, said pillars defining an area for formation of a bipolar transistor;

forming a second set of isolation regions corresponding to said second buried region, said set including third and fourth pillars extending between and contacting a surface of said third semiconductor layer and said second semiconductor layer, said pillars defining an area for formation of a field effect transistor;

forming a third buried region of said second conductivity type between said second and third semiconductor layers between said second set of isolation regions;

forming a lightly doped impurity region of said conductivity type extending between and contacting a surface of said third semiconductor layer and said third buried region;

forming emitter, base and collector regions corresponding to said bipolar transistor;

forming source and drain regions of said second conductivity type within said second set of isolation regions for forming a field effect transistor of said second conductivity type; and forming source and drain regions of said first conductivity type within said lightly doped impurity region for forming a field effect transistor of said first conductivity type.

* * * * *